US011533826B2

(12) United States Patent
Gao

(10) Patent No.: US 11,533,826 B2
(45) Date of Patent: Dec. 20, 2022

(54) AIR COOLING SYSTEM FOR COMPONENT HIGH DENSE CLUSTERS

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 16/899,424

(22) Filed: Jun. 11, 2020

(65) Prior Publication Data

US 2021/0392789 A1     Dec. 16, 2021

(51) Int. Cl.
*H05K 7/20*     (2006.01)
*H05K 7/14*     (2006.01)

(52) U.S. Cl.
CPC ....... *H05K 7/20727* (2013.01); *H05K 7/1489* (2013.01); *H05K 7/1497* (2013.01); *H05K 7/20145* (2013.01); *H05K 7/20172* (2013.01); *H05K 7/20745* (2013.01)

(58) Field of Classification Search
CPC ............. H05K 7/20727; H05K 7/1497; H05K 7/20145; H05K 7/20172; H05K 7/1489; H05K 7/20745
See application file for complete search history.

(56) References Cited

U.S. PATENT DOCUMENTS

| | | | | |
|---|---|---|---|---|
| 6,909,611 B2* | 6/2005 | Smith | ...................... | G06F 1/181 |
| | | | | 312/223.1 |
| 7,016,191 B2* | 3/2006 | Miyamoto | ........... | G11B 33/144 |
| | | | | 361/679.33 |
| 7,508,663 B2* | 3/2009 | Coglitore | ........... | H05K 7/20736 |
| | | | | 165/122 |
| 7,857,688 B1* | 12/2010 | Cunningham | ..... | H05K 7/20736 |
| | | | | 454/184 |
| 7,916,470 B2* | 3/2011 | Mills | ........................ | G06F 1/20 |
| | | | | 361/679.49 |
| 8,315,052 B2* | 11/2012 | Chan | .................. | H05K 7/20736 |
| | | | | 361/695 |
| 8,537,539 B2* | 9/2013 | Doll | ........................ | G06F 1/20 |
| | | | | 361/679.5 |

(Continued)

FOREIGN PATENT DOCUMENTS

| CN | 104508592 A | 4/2015 |
|---|---|---|
| CN | 104679149 A | 6/2015 |

(Continued)

*Primary Examiner* — Stephen S Sul
(74) *Attorney, Agent, or Firm* — Womble Bond Dickinson (US) LLP

(57) ABSTRACT

Cooling systems of one or more electronic racks in a cluster or point of deliver (PoD) are disclosed. A data center system includes an array of electronic racks. Each electronic rack contains a number of server chassis. The system further includes a number of rear cooling doors respectively connected to the electronic racks. Each rear cooling door cools warm/hot air exhaust from a corresponding electronic rack. The system further includes a number of airflow distributors. Each airflow distributor attaches to a side of an electronic rack to supply and distribute a cool/cold airflow to the electronic rack. The distributor either assembled in the PoD or pre-attached with the racks. The system further includes a containment to direct the cooled air towards the airflow distributors.

11 Claims, 7 Drawing Sheets

(56) References Cited

U.S. PATENT DOCUMENTS

| | | | | |
|---|---|---|---|---|
| 9,995,500 | B2* | 6/2018 | Dow | F24F 11/30 |
| 10,028,401 | B2* | 7/2018 | Shaw | H05K 7/20709 |
| 10,539,985 | B2* | 1/2020 | Beall | G06F 1/187 |
| 10,631,440 | B1* | 4/2020 | Beall | H05K 7/20736 |
| 2005/0280986 | A1* | 12/2005 | Coglitore | H05K 7/20736 |
| | | | | 361/679.49 |
| 2010/0134972 | A1* | 6/2010 | Moss | H05K 7/20736 |
| | | | | 165/80.2 |
| 2011/0232889 | A1* | 9/2011 | Eckberg | F28D 1/0477 |
| | | | | 165/200 |
| 2011/0255237 | A1* | 10/2011 | Doll | H05K 7/20736 |
| | | | | 361/679.46 |
| 2013/0019627 | A1* | 1/2013 | Yoshikawa | H05K 7/20818 |
| | | | | 62/259.2 |
| 2015/0116929 | A1* | 4/2015 | Shabbir | H05K 7/20736 |
| | | | | 361/679.48 |
| 2015/0146363 | A1* | 5/2015 | Wei | H05K 7/20727 |
| | | | | 361/679.31 |
| 2015/0208554 | A1* | 7/2015 | Leigh | G06F 1/20 |
| | | | | 165/80.3 |
| 2016/0330871 | A1* | 11/2016 | Klein | H05K 7/20736 |
| 2018/0110154 | A1* | 4/2018 | Mayer | H05K 7/20145 |
| 2019/0357380 | A1* | 11/2019 | Preuss | G06F 1/182 |
| 2019/0357390 | A1* | 11/2019 | Preuss | H05K 7/20145 |
| 2021/0185858 | A1* | 6/2021 | VanGilder | H05K 7/20563 |

FOREIGN PATENT DOCUMENTS

| | | |
|---|---|---|
| CN | 107710894 A | 2/2018 |
| CN | 109862746 A | 6/2019 |
| CN | 110447315 A | 11/2019 |

\* cited by examiner

AIR COOLING SYSTEM FOR COMPONENT HIGH DENSE CLUSTERS

FIELD OF THE INVENTION

Embodiments of the present invention relate generally to data center cooling. More particularly, embodiments of the invention relate to an air cooling system for high density storage clusters.

BACKGROUND

Cooling is a prominent factor in a computer system and data center design. The number of high performance electronic components such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime, energy efficiency and cost. It requires more effective and efficient cooling solutions including cooling airflow management method especially in the cases of cooling these high performance servers.

In a high density cluster (or a collection of data centers) or point of delivery (PoD), there are many problems and challenges exist in those infrastructure and hardware system. The cluster or PoD are populated with information technology (IT) equipment packaged with bunches of disks or drives (also referred to as just a bunch of disks or just a bunch of drives (JBOD)). This type of IT equipment population method is used in computing and storage separation architecture in cloud computing infrastructures. However, the first challenge those infrastructures and systems pose is thermal management. Because they are mass-intensive designs and component dense systems, airflow resistance is relatively high. The temperature gradient is high and in high non-uniformity, thereby resulting in the drives operating in different temperatures.

The second challenge is packaging requirement. In order to decrease storage cost, the packaging density is required to become more and more dense. For example, it is common to have over 100 drives packaged in a 4U height space, and perhaps even more. Therefore, the space of implementing advanced thermal equipment within a chassis may be very difficult, if not impossible. When sacrificing some space for implementing thermal equipment may impact on the storage packaging density, which may result in negative impact on the system configuration. This would require innovative design on both the hardware and cluster side.

The third challenge is cost. Cost is a major challenge when solving modern issues in the cloud computing industry or introducing innovative solutions. It is always a key to develop cost effective solutions. If the solution or design provides some level of resilience for hardware iteration, then the solution provides a strong core competence for a company and its related businesses.

Conventional thermal management solutions, such as air cooling or hybrid (liquid-air) cooling solutions, primarily focus on traditional IDC and hardware environment using cold aisle and hot aisle arrangements. In those solutions, the cooling air is supplied from the rack and server inlet exist in the cold aisle and exited the server and rack from the rear sides at the hot aisle side. Unfortunately, conventional solutions are mainly developed and highly optimized based on a conventional server system, which means that they may not be proper or efficient for some new hardware configurations, such as in a high component dense package arrangement of servers or PoDs.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
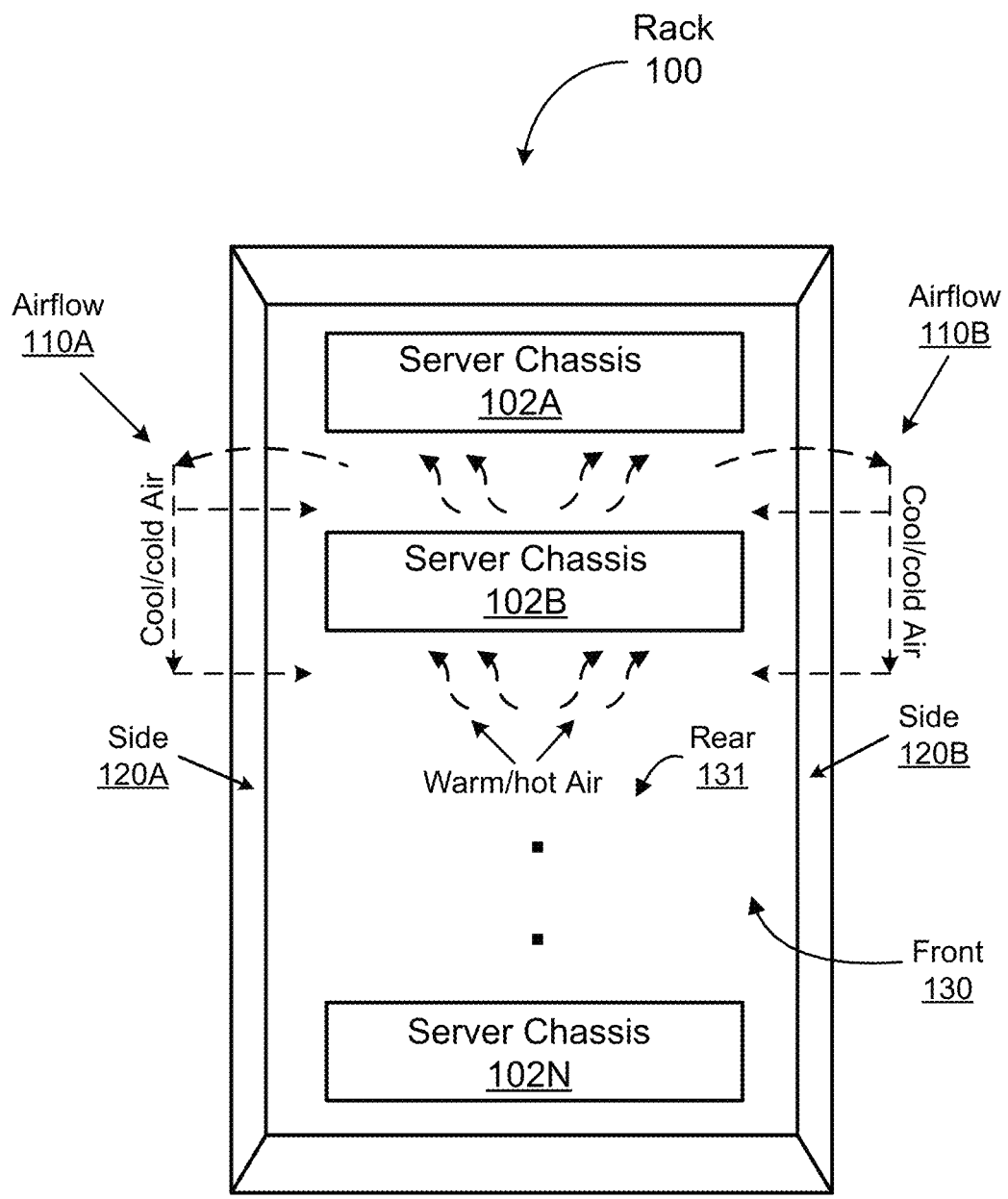
FIG. 1 is a diagram illustrating an example front view of a rack according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Embodiments of the disclosure introduce an innovative design from hardware to clusters. Disclosed herein is a novel airflow managing solution for cooling a storage cluster, which is populated with hundreds of JBODs, or similar clusters which are high dense ones. According to some embodiments, a cooling architecture for a cluster populated with high-density packaged JBODs is provided. An airflow is supplied from the two sides of a rack by using airflow distributors. The airflow distributors are used on both sides of the rack for distributing airflow to the rack from the side. The rack's side panels may be removed or the racks are designed with no panel, or the two sides of racks are designed to enable airflow to pass effectively. The server chassis is designed to enable airflow to pass from the side by introducing openings or perforated design. Cooling coil is used on the rear side of the rack for cooling the airflow. The airflow is arranged in a completely new manner compared to a hot aisle-cold aisle fashion and front to rear airflow management system. The airflow is cooled by a rear door and is then supplied to a hot aisle containment. The airflow then enters into the airflow distributors, separated into different channels before supplied to the racks and server chassis. The airflow also enters the server chassis from two sides and leaves the server chassis from the rear end of the chassis. In one embodiment, fan systems assembled on the racks or within the servers may be used for recirculating the airflow.

According to one aspect, an electronic rack is disclosed. The rack includes a number of server chassis. Each server chassis contains one or more servers. The rack further includes a rack frame and supporting beams to form a number of server slots that receive the server chassis, respectively, from a frontend of the electronic rack. The rack further includes a first opening side and a second opening side to allow an airflow of cool/cold air to flow through each server chassis to cool the one or more servers.

In one embodiment, each of the first and second opening sides is entirely opened and does not include a cover panel. In another embodiment, each of the first and second opening sides includes a perforated structure. Each server chassis may include a first side and a second side, where each of the first and second sides of the server chassis does not include a side panel or includes a perforated side panel. In one embodiment, the rack further includes a number of fan systems to circulate warm/hot air out of the electronic rack from a backend of the electronic rack, where each fan system is mounted to a rear end of a corresponding server chassis or mounted to the backend of the electronic rack.

According to another aspect, a modular cooling system of an electronic rack is disclosed. The system includes a first airflow distributor coupled to a first side of the electronic rack. The first airflow distributor supplies a first airflow of cool/cold air through the first side of the electronic rack. The system further includes a second airflow distributor coupled to a second side of the electronic rack. The second airflow distributor supplies a second airflow of cool/cold air through the second side of the electronic rack. The system further includes a rear cooling door coupled to a backend of the electronic rack to cool warm/hot air exhaust from the backend of the electronic rack, where the cooled air is distributed to the first and second airflow distributors. In one embodiment, the rear cooling door can be separated modular cooling unit assembled at each server.

According to yet another aspect, a data center system is disclosed. The system includes an array of electronic racks. Each electronic rack contains a number of server chassis. The system further includes a number of rear cooling doors respectively connected to the electronic racks. Each rear cooling door cools warm/hot air exhaust from a corresponding electronic rack. In one embodiment, the system further includes a number of airflow distributors. Each airflow distributor attaches to a side of an electronic rack to supply an airflow of cool/cold air to the electronic rack. In one embodiment, the system further includes a containment to direct the cooled air towards the airflow distributors. The cooled air is intake by the airflow distributors.

The key concept of the current disclosure is to utilize larger supply area to supply and manage cooling airflow to the rack, such as the two sides of the rack are designed and used in the architecture proposed in the present disclosure.

FIG. 1 is a diagram illustrating an example front view of a rack according to one embodiment. Referring to FIG. 1, electronic rack 100 may be part of a data center system and a cluster that include one or more rows of electronic racks of information technology (IT) components, equipment or instruments, such as, for example, computer servers or computing nodes that provide data services to a variety of clients over a network (e.g., the Internet). Although not shown in FIG. 1, in one embodiment, rack 100 further includes a housing to house a number of IT components arranged in a stack operating therein. The rack 100 can include a number of server slots (e.g., standard shelves or chassis configured with an identical or similar form factor).

As shown in FIG. 1, electronic rack 100 can include one or more server chassis 102A-102N (collectively referred to as server chassis 102). Server chassis 102 (also referred to as server blades or server shelves) can be inserted into an array of server slots (e.g., standard shelves) respectively from a frontend 130 or a backend/rear end 131 of electronic rack 100. Each of server chassis 102 may represent a computing node having one or more processors, a memory, and/or a persistent storage device (e.g., hard disk), where the computing node may include one or more servers operating therein. Note that although there are three server chassis 102A-102N shown here, more or fewer server chassis may be maintained within electronic rack 100. Also note that the particular positions of server chassis 102 are shown for the purpose of illustration only, and other arrangements or configurations of server chassis 102 may also be implemented. In one embodiment, the server chassis are dense storage devices ones.

In one embodiment, electronic rack 100 can be either open to the environment or partially contained by a rack container, as long as air can flow from the frontend and/or opening sides 120A-120B to the backend. In one embodiment, a fan module or system (not shown) is associated with each of the server chassis 102. Each of the fan modules includes one or more cooling fans. The fan modules may be mounted on the backends of server chassis 102 or on the electronic rack 100 to generate airflows 110A-110B flowing from the frontend and/or opening sides 120A-120B traveling through the air space of the sever chassis 102, and exiting at the backend of electronic rack 100. For example, in FIG. 1, each of the fan modules may circulate warm/hot air exhaust from rack 100 out towards and through the backend of rack 100. In one embodiment, the backend of rack 100 may include a rear door cooler (not shown), such as a cooling door, that is used to cool the exhaust warm/hot air from rack 100 (e.g., using a liquid cooling system with the rear door). The cooled air by the rear door can be returned or supplied back (e.g., using airflow distributors) to rack 100 through sides 120A-120B. In one embodiment, each of the sides 120A-120B of rack 100 may be entirely opened (e.g., lacking a cover panel) so that the cooled air can flow through rack 100. In another embodiment, each of the sides 120A-120B may include a structure (e.g., a panel) having perforated portions through which the cooled air can effectively flow.

Figure 2:
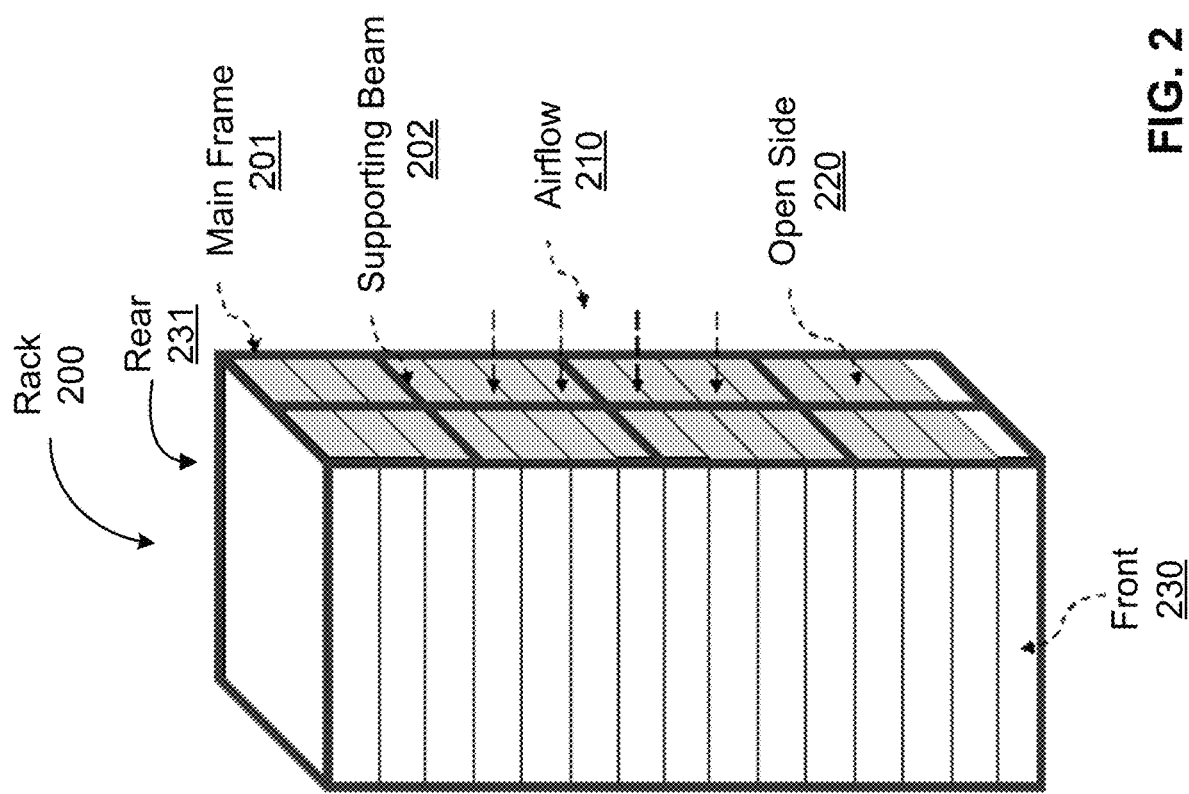
FIG. 2 is a diagram illustrating a rack design according to one embodiment.

FIG. 2 is a diagram illustrating a rack design according to one embodiment. In some embodiments, rack 200 is the same as or similar to rack 100 of FIG. 1. As shown, rack 200 includes a main frame (or rack frame) 201 and a number of supporting beams, such as supporting beam 202. Main frame 201 is the main supporting structure of rack 200 that houses and supports server chassis (e.g., server chassis 102 of FIG. 1) through a number of server slots attached to main frame 201. Though not shown, main frame 201 may also house and support other IT and cooling components within rack 200. Each of the supporting beams (e.g., supporting beam 202) is attached to main frame 201 to form and house a number of server slots (e.g., standard shelves or chassis configured with an identical or similar form factor). Each server slot may contain and support one or more server chassis. Several slots may contain one chassis, while multiple electronics component packaged within the chassis.

With continued reference to FIG. 2, rack 200 may include an opening side 220 so that an airflow of cool/cold air 210 can effectively pass through rack 200. For example, open side 220 may lack a side panel (i.e., the panel is removed entirely), or alternatively, open side 220 may have major airflow blockers (e.g., certain portions of the side panel) removed. In some embodiments, front end 230 of rack 200 may have identical or similar design as a commercially available rack or any open platform rack. Airflow leaves the rack at rear end 231 of rack 200. Front end 230 can be used for populating IT equipment or electronic components, for example central processing units (CPUs)/graphics processing units (GPUs)/application specific integrated circuit (ASIC), arranged in a stack, for example, in rack 200. Note that although an airflow may enter through rack 200 from front end 230, such airflow does not impact the rack design of FIG. 2 or other embodiments disclosed herein.

Figure 3:
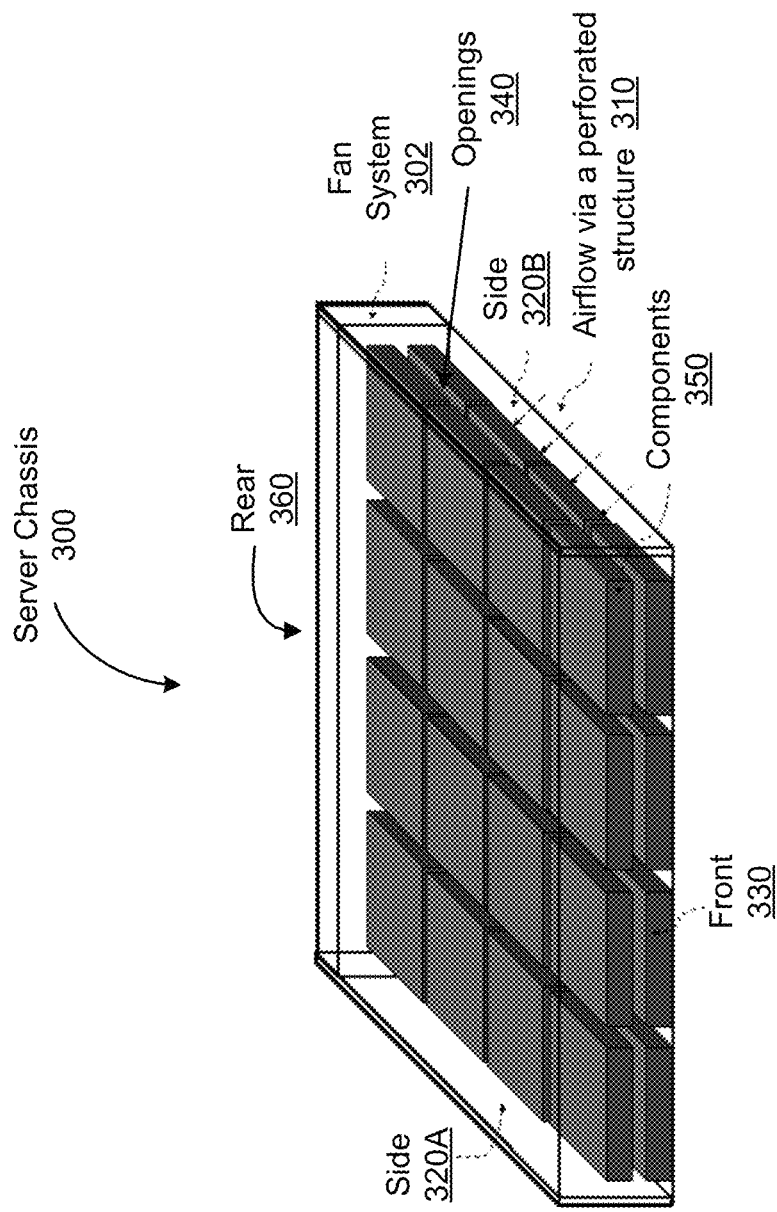
FIG. 3 is a diagram illustrating an example of a server chassis according to one embodiment.

FIG. 3 is a diagram illustrating an example of a server chassis according to one embodiment. In FIG. 3, server chassis 300 may include a first side 320A and a second side 320B. Sides 320A-320B of server chassis 300 may be customized to eliminate any side panel or to include a perforated side panel or structure, so that airflow 310 can effectively pass through and cool IT components 350 via openings or gaps 340 in between layers of IT components 350. In one embodiment, front end 330 of chassis 300 can be used for serving or populating an array of IT components 350 (e.g., CPUs, GPUs, ASICs, hard disks, SSD, etc.). A rear/back end 360 of chassis 300 may have a fan system 302 mounted thereto, though fan system 302 may be mounted on a backend of a rack, such as back/rear end 231 of rack 200, in some embodiments. In one embodiment, fan system 302 includes one or more cooling fans to circulate warm/hot air out of the back end 360 of chassis 300 and then the rear end of a rack, such as rear end 231 of rack 200.

Figure 4A:
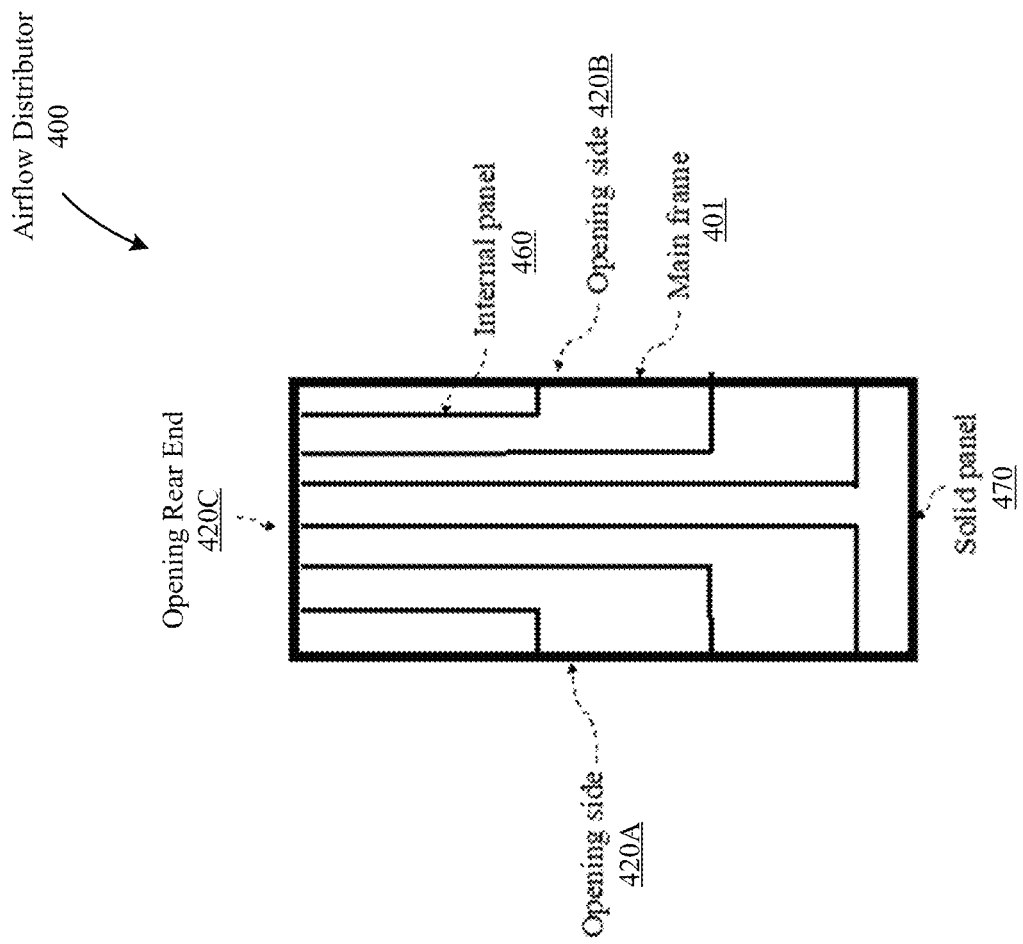
FIG. 4A is a diagram illustrating a top view of an airflow distributor according to one embodiment.

FIG. 4A is a diagram illustrating a top view of an airflow distributor according to one embodiment. Referring to FIG. 4A, airflow distributor 400 may include a main frame 401, opening sides 420A-420B, opening rear end 420C, frontend 470, and a number of internal panels, such as internal panel 460, housed and supported by main frame 401. In some embodiments, airflow distributor 400 can be used for distributing and managing airflow. For example, airflow distributor 400 may intake an airflow of cool/cold air through rear end 420C from a containment, and supply the airflow to one or more racks (e.g., rack 100/200) evenly through both opening sides 420A-420B. The internal panels (e.g., panel 460) can be used to separate the airflow for airflow distributions to different areas of the rack. The frontend 470 may include a solid panel to prevent the intake air from flowing through frontend 470, thereby forcing the intake air to exit through opening sides 420A-420B. In another embodiment, the solid panel 470 may be also perforated ones to enable some portion of airflow going through the panel, then to be supplied to the cold aisle. In one embodiment, airflow distributor 400 can be used as facility level equipment and populated in a cluster or PoD. Airflow distributor 400 can be disposed in between and coupled (or attached) to a pair of racks so that the intake airflow can be supplied to both racks. In one embodiment, airflow distributor 400 may include one or more air valves (not shown) to control the airflow of incoming and outgoing air. In one embodiment, airflow distributor 400 may include a blocking door (also not shown) to block an opening side (e.g., opening side 420A/420B). Therefore, in this embodiment, airflow distributor 400 can only supply the airflow through one of the opening sides (e.g., opening side 420A/420B) thereby supplying the airflow to only one side of a rack (e.g., rack 100/200). As such, airflow distributor 400, in this embodiment, can be coupled or attached to a rack at the end of a PoD or cluster.

Figure 4B:
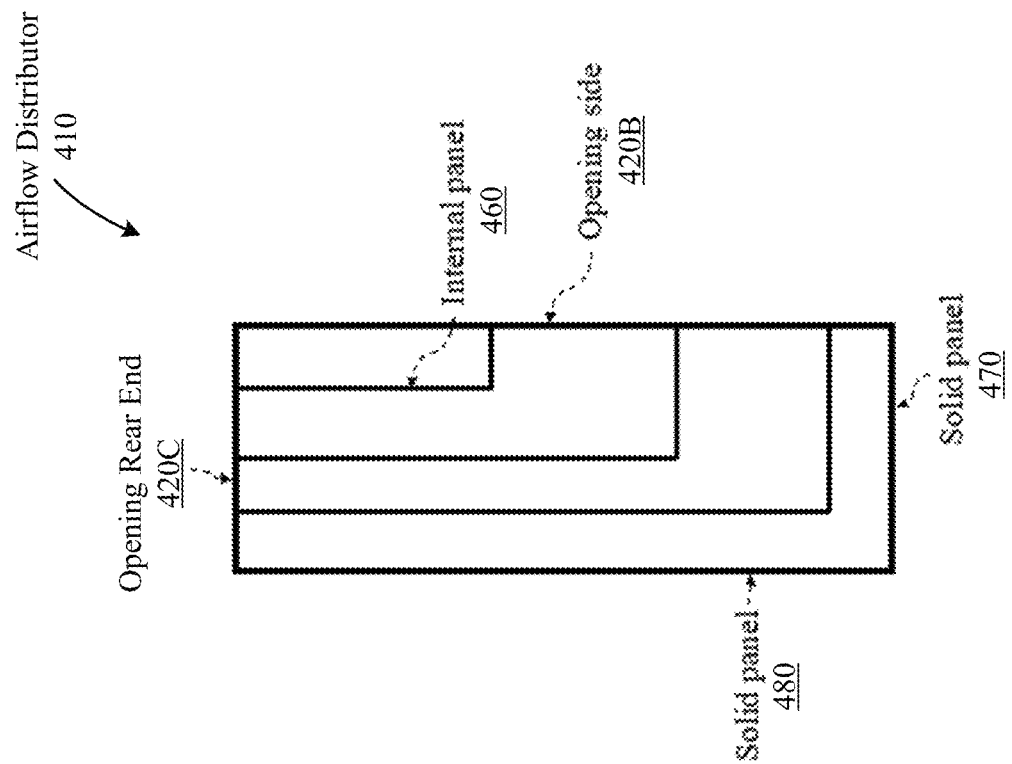
FIG. 4B is a diagram illustrating the top view of an airflow distributor for one side of the rack according to one embodiment.

FIG. 4B is a diagram illustrating the top view of an airflow distributor for one side of the rack according to one embodiment. In FIG. 4B, airflow distributor 410 is configured to supply an airflow of cool/cold air to one side of a rack (e.g., rack 100/200). As shown, airflow distributor 410 includes a front end 470, opening side 420B, opening rear end 420C and a number of internal panels, such as internal panel 460. The details of these components have been previously described with respect to FIG. 4A, and therefore, will not be described again herein. In one embodiment, airflow distributor 410 further includes a side 480. Side 480 may include a solid panel to prevent the intake air from flowing through side 480, thereby forcing the intake air to exit through opening side 420B. In one embodiment, airflow distributor 410 can be coupled or attached to an outermost rack in a row of racks. Airflow distributor 410 can also be coupled or attached to a rack at the end of a PoD or cluster.

Figure 5:
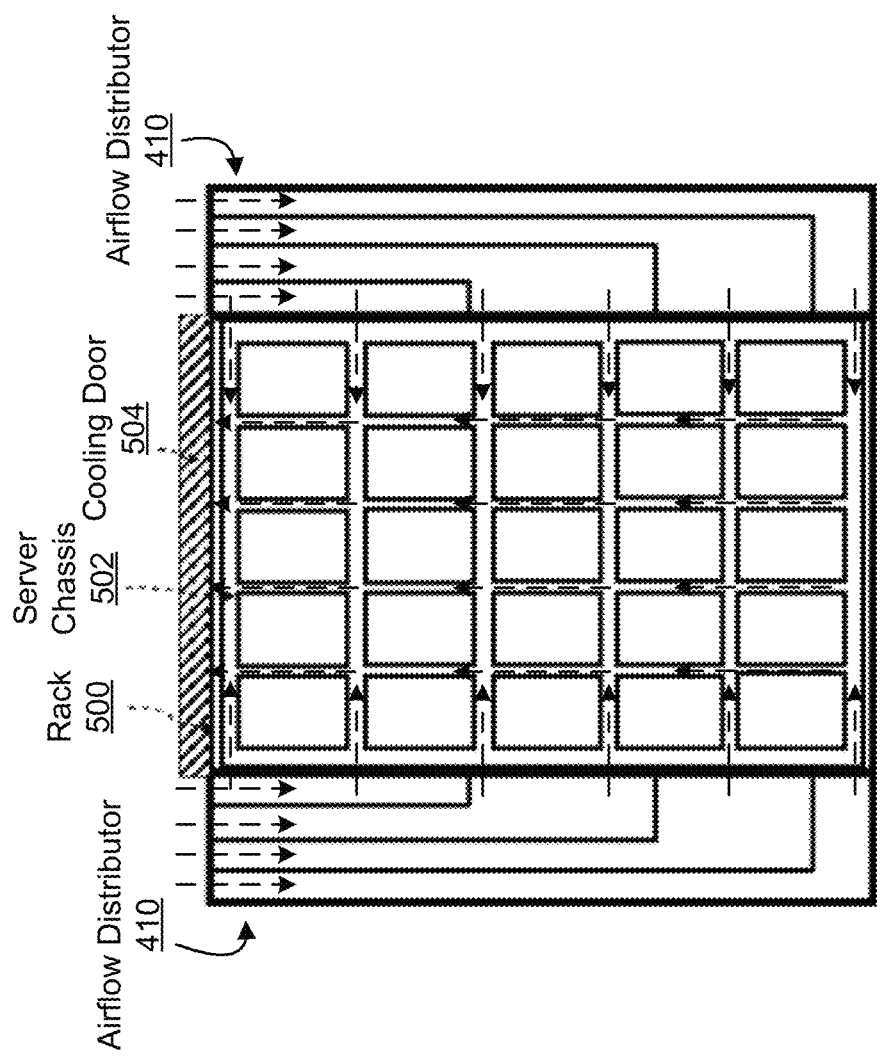
FIG. 5 is a diagram illustrating a top view of a modular cooling system design of a rack with airflow distributors assembled on both sides of the rack according to one embodiment.

FIG. 5 is a diagram illustrating a top view of a modular cooling system design of a rack with airflow distributors assembled on both sides of the rack according to one embodiment. In FIG. 5, rack 500 includes a number of server chassis 502. Each server chassis 502 may represent server chassis 300 of FIG. 3. As shown, airflow distributor 410 of FIG. 4B may be attached to the left side and right side of rack 500. Rack 500 may represent rack 100/200 in some embodiments. Here, a backend of rack 500 is attached to a rear cooling door 504. Although not shown, rear cooling door 504 may include a heat exchanger coil that receives cooling liquid to cool the warm/hot air flowing out of the backend of rack 500. The cooled air may then be directed towards both airflow distributors 410, which supply the cooled air to both sides of rack 500, respectively.

In operation, fan modules (attached to server chassis 502 or the backend of rack 500) may circulate warm/hot air exhaust from rack 500 out towards and through the backend of rack 500. Rear cooling door 504 may then be used to cool the exhaust warm/hot air from rack 500 (e.g., using a liquid cooling system with cooling door 504). The cooled air can be returned or supplied back, using airflow distributors 410, to rack 500 through the left and right sides of rack 500. Each side of rack 500 may be entirely opened (e.g., lacking a cover panel) so that the cooled air can effectively flow through rack 500. In another embodiment, each side may include a structure (e.g., a panel) having perforated portions through which the cooled air can effectively flow.

Figure 6:
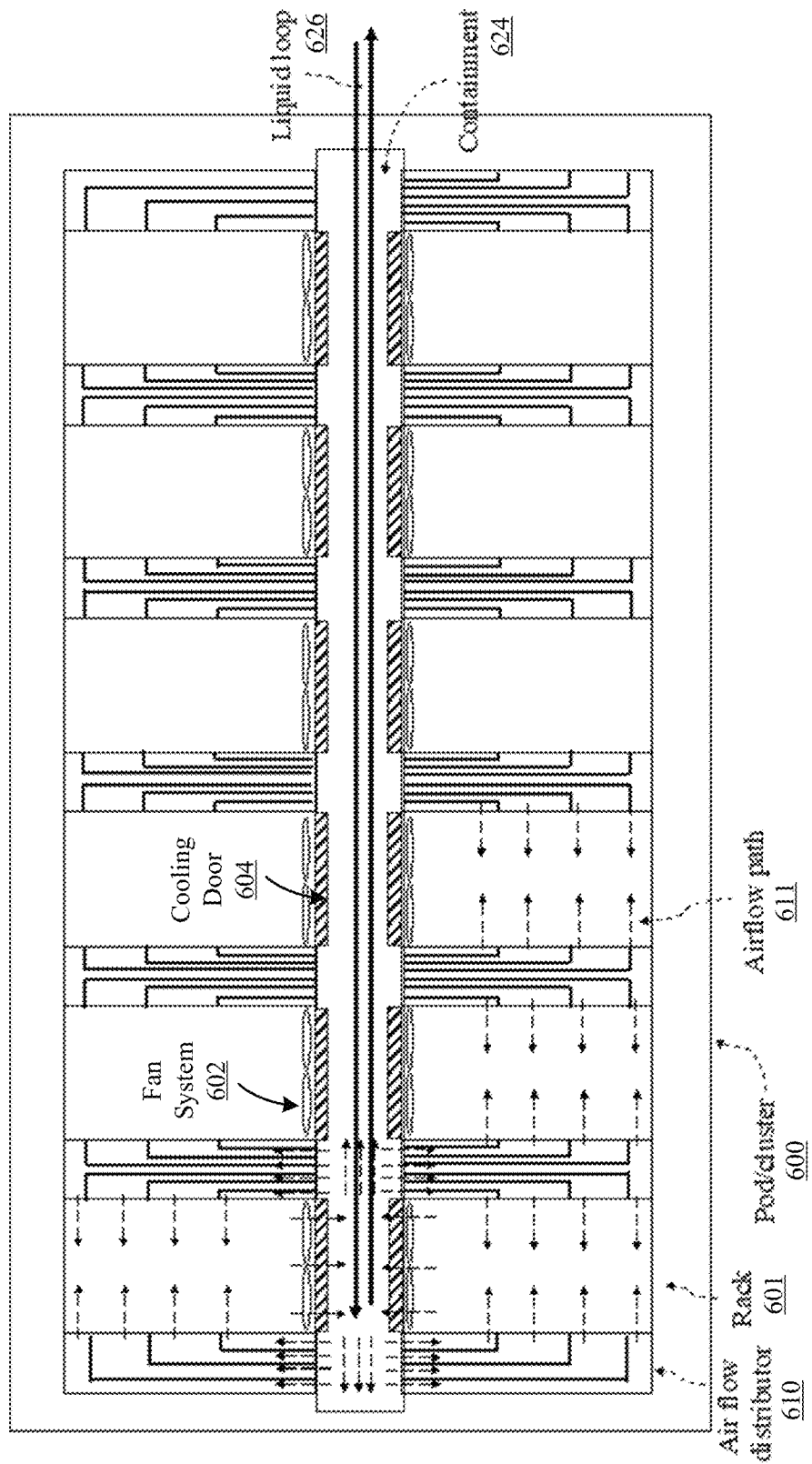
FIG. 6 is a schematic diagram illustrating an example of a cluster system according to one embodiment.

FIG. 6 is a schematic diagram illustrating an example of a cluster system according to one embodiment. Referring to FIG. 6, PoD or cluster system 600 includes a number of racks, such as rack 601, arranged in one or more rows of racks. The rows of racks may be arranged in a back-to-back fashion. Each rack may represent any of the foregoing racks 100/200/500. In system 600, each side of each rack (e.g., rack 601) is equipped with an airflow distributor 610 attached thereto. Airflow distributor 610 may represent airflow distributor 400/410 of FIG. 4A/4B. In addition, a backend of each rack is attached to a rear cooling door, such as cooling door 504 of FIG. 5.

With continued reference to FIG. 6, in one embodiment, a fan system (e.g., fan system 602) may be mounted to a backend of each rack. In another embodiment, the fan system may be mounted to a backend of each server chassis within the rack. The details of the fan system have been previously described with respect to FIG. 3, and will not be described again herein. In one embodiment, liquid loop 626 is used to deliver and distribute cooling fluid to the rear cooling doors attached to the racks. Each cooling door may use the distributed cooling fluid to cool the warm/hot air exhaust from the rack (e.g., using air-to-liquid heat exchange) and return warm/hot fluid through liquid loop 626. Note that simplified liquid cooling loop is presented with some portion eliminated in FIG. 6. Containment 624 (which may be referred to as a cold aisle) may be disposed at the rear ends of the rows of racks. As warm/hot air is exhausted from the rear ends of the racks and cooled by the rear cooling doors, containment 624 may contain and direct the cooled air towards the air distributors (e.g., air distributor 610), which supply the cooled air through the sides of the racks (as shown by airflow path 611) to cool the IT components within the racks.

In FIG. 6, the fan system, such as fan system 602 that may be mounted to the backend of each rack or backend of each server chassis, may circulate warm/hot air exhaust from each rack out towards and through the backend of the rack. Each rack may include a rear cooling door (e.g., cooling door 604) to extract the heat from the exhaust warm/hot air from the rack using the cooling fluid recirculated by liquid loop 626. The cooled air can be returned or supplied back through the sides of the rack using airflow distributors (e.g., air flow distributor 610). As previously described, each of the sides of the rack (e.g., rack 601) may be entirely opened (e.g., lacking a cover panel) so that the cooled air can flow through the rack. In another embodiment, each of the sides may include a structure (e.g., a panel) having perforated portions through which the cooled air can effectively flow.

Note that in cluster system 600, each airflow distributor can be airflow distributor 400 of FIG. 4A or airflow distributor 410 of FIG. 4B regardless where its corresponding rack is located (e.g., end of the row or not) since system 600 is modular in design. Also, different population and deployment methods can be considered in actual application scenarios. In some embodiments, the cooling liquid delivered through liquid loop 626 can be supplied by any cooling fluid system disposed at any location. In some embodiments, a room containing system 600 may also be cooled by other cooling equipment. As such, system 600 can be mixed with an existing data center hall. Herein, containment 624 may include a shared containment region (as shown), or each row of racks may have its associated containment region.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An electronic rack, comprising:
a plurality of server chassis, each server chassis of the plurality of server chassis containing one or more electronic components;
a rack frame and supporting beams to form a plurality of server slots that receive the plurality of server chassis, respectively, from a frontend of the electronic rack; and
a first opening side and a second opening side to allow an airflow of cool/cold air to flow through each server chassis of the plurality of server chassis to cool the one or more electronic components, wherein each of the first opening side of the electronic rack and the second opening side of the electronic rack is entirely opened and does not include a cover panel, thereby allowing the airflow of cool/cold air to effectively flow through the electronic rack by one or more coupled to the first opening side and the second opening side.

2. The electronic rack of claim 1, wherein each server chassis of the plurality of server chassis includes a first side and a second side, wherein each of the first and second sides of each of the plurality of server chassis does not include a side panel.

3. The electronic rack of claim 2, further comprising a plurality of fan systems to circulate warm/hot air out of the electronic rack from a backend of the electronic rack, wherein each fan system is mounted to a rear end of a corresponding server chassis of the plurality of server chassis or mounted to the backend of the electronic rack.

4. The electronic rack of claim 3, wherein each fan system comprises one or more cooling fans.

5. A modular cooling system of an electronic rack, comprising:
a first airflow distributor coupled to a first side of the electronic rack, the first airflow distributor to supply a first airflow of cool/cold air through the first side of the electronic rack;
a second airflow distributor coupled to a second side of the electronic rack, the second airflow distributor to supply a second airflow of cool/cold air through the second side of the electronic rack, wherein each of the first side of the electronic rack and the second side of the electronic rack is entirely opened and does not include a cover panel, thereby allowing the first airflow of cool/cold air and the second airflow of cool/cold air to effectively flow through the electronic rack;
a rear cooling door coupled to a backend of the electronic rack to cool warm/hot air exhaust from the backend of the electronic rack, wherein the cooled air is distributed to the first and second airflow distributors comprising an opening rear end to intake the distributed cooled air, wherein the first and second airflow distributors comprise internal panels to separate the intake cooled air for airflow distributions to the electronic rack.

6. The modular cooling system of claim 5, wherein the first airflow distributor comprises:
a first opening side through which the first airflow of cool/cold air is supplied, and
a second side including a solid panel and a frontend including solid panel to collectively prevent the first airflow of cool/cold air from flowing through the second side or the frontend, thereby forcing the first airflow of cool/cold air to exit through the first opening side of the first airflow distributor.

7. The modular cooling system of claim 6, wherein the second airflow distributor comprises:
a first opening side through which the second airflow of cool/cold air is supplied to the second side of the electronic rack, and
a second side including a solid panel and a frontend including solid panel to collectively prevent the second airflow of cool/cold air from flowing through the second side or the frontend, thereby forcing the second airflow of cool/cold air to exit through the first opening side of the second airflow distributor.

8. The modular cooling system of claim 5, wherein each of the first side of the electronic rack and the second side of the electronic rack includes a perforated structure, thereby allowing the first airflow of cool/cold air and the second airflow of cool/cold air to effectively flow through the electronic rack.

9. The modular cooling system of claim 5, wherein the electronic rack includes a plurality of server chassis, each server chassis of the plurality of server chassis including a first side and a second side, wherein each of the first and second sides of each of the plurality of server chassis does not include a solid side panel or includes a perforated side panel to allow the first airflow of cool/cold air and the second airflow of cool/cold air to effectively flow through the plurality of server chassis.

10. A modular cooling system of an electronic rack, comprising:
   a first airflow distributor coupled to a first side of the electronic rack, the first airflow distributor to supply a first airflow of cool/cold air through the first side of the electronic rack, wherein the first airflow distributor comprises:
      a first opening side and a second opening side through which the first airflow of cool/cold air is supplied, and
      a frontend including a solid panel to prevent the first airflow of cool/cold air from flowing through the frontend, thereby forcing the first airflow of cool/ cold air to exit through the first and second opening sides of the first airflow distributor;
   a second airflow distributor coupled to a second side of the electronic rack, the second airflow distributor to supply a second airflow of cool/cold air through the second side of the electronic rack;
   a rear cooling door coupled to a backend of the electronic rack to cool warm/hot air exhaust from the backend of the electronic rack, wherein the cooled air is distributed to the first and second airflow distributors comprising an opening rear end to intake the distributed cooled air, wherein the first and second airflow distributors comprise internal panels to separate the intake cooled air for airflow distributions to the electronic rack.

11. The modular cooling system of claim 10, wherein the second airflow distributor comprises:
   a first opening side and a second opening side through which the second airflow of cool/cold air is supplied, and
   a frontend including a solid panel to prevent the second airflow of cool/cold air from flowing through the frontend, thereby forcing the second airflow of cool/cold air to exit through the first and second opening sides of the second airflow distributor.

* * * * *